(12) United States Patent
Yang et al.

(10) Patent No.: US 11,351,635 B2
(45) Date of Patent: Jun. 7, 2022

(54) APPARATUS AND METHOD FOR DIRECTIONAL ETCH WITH MICRON ZONE BEAM AND ANGLE CONTROL

(71) Applicant: Taiwan Semiconductor Manufacturing Co., Ltd., Hsin-Chu (TW)

(72) Inventors: Chansyun David Yang, Shinchu (TW); Li-Te Lin, Hinchu (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 93 days.

(21) Appl. No.: 16/653,401

(22) Filed: Oct. 15, 2019

(65) Prior Publication Data

US 2020/0130102 A1    Apr. 30, 2020

Related U.S. Application Data

(60) Provisional application No. 62/752,492, filed on Oct. 30, 2018.

(51) Int. Cl.
| | |
|---|---|
| *B23K 26/348* | (2014.01) |
| *H01L 21/3115* | (2006.01) |
| *B23K 26/067* | (2006.01) |
| *B23K 26/06* | (2014.01) |
| *H01L 21/311* | (2006.01) |

(52) U.S. Cl.
CPC ........ *B23K 26/348* (2015.10); *B23K 26/0643* (2013.01); *B23K 26/0676* (2013.01); *H01L 21/31116* (2013.01); *H01L 21/31155* (2013.01)

(58) Field of Classification Search
CPC combination set(s) only.
See application file for complete search history.

(56) References Cited

U.S. PATENT DOCUMENTS

| | | | | |
|---|---|---|---|---|
| 2010/0117009 | A1* | 5/2010 | Moriya | ................ H01S 3/2308 250/504 R |
| 2011/0176139 | A1* | 7/2011 | Yamaguchi | ........ G01B 9/02044 356/456 |
| 2016/0147161 | A1* | 5/2016 | Nikipelov | ............ H01S 3/0903 355/67 |

* cited by examiner

*Primary Examiner* — Ratisha Mehta
(74) *Attorney, Agent, or Firm* — Haynes and Boone, LLP

(57) ABSTRACT

A semiconductor fabrication apparatus includes a source chamber being operable to generate charged particles; and a processing chamber integrated with the source chamber and configured to receive the charged particles from the source chamber. The processing chamber includes a wafer stage being operable to secure and move a wafer, and a laser-charged particles interaction module that further includes a laser source to generate a first laser beam; a beam splitter configured to split the first laser beam into a second laser beam and a third laser beam; and a mirror configured to reflect the third laser beam such that the third laser beam is redirected to intersect with the second laser beam to form a laser interference pattern at a path of the charged particles, and wherein the laser interference pattern modulates the charged particles by in a micron-zone mode for processing the wafer using the modulated charged particles.

20 Claims, 12 Drawing Sheets

APPARATUS AND METHOD FOR DIRECTIONAL ETCH WITH MICRON ZONE BEAM AND ANGLE CONTROL

PRIORITY DATA

This application claims priority to U.S. Provisional Patent Application Ser. No. 62/752,492 filed Oct. 30, 2018, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, an etching process, such as plasma etching, may unexpectedly change dimensions of a pattern due to the characteristics of the etching process, which may further lead to short, bridging or other quality and reliability issues. Accordingly, it would be desirable to provide a semiconductor fabrication system and a method of utilizing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussions.

DETAILED DESCRIPTION

Figure 1:
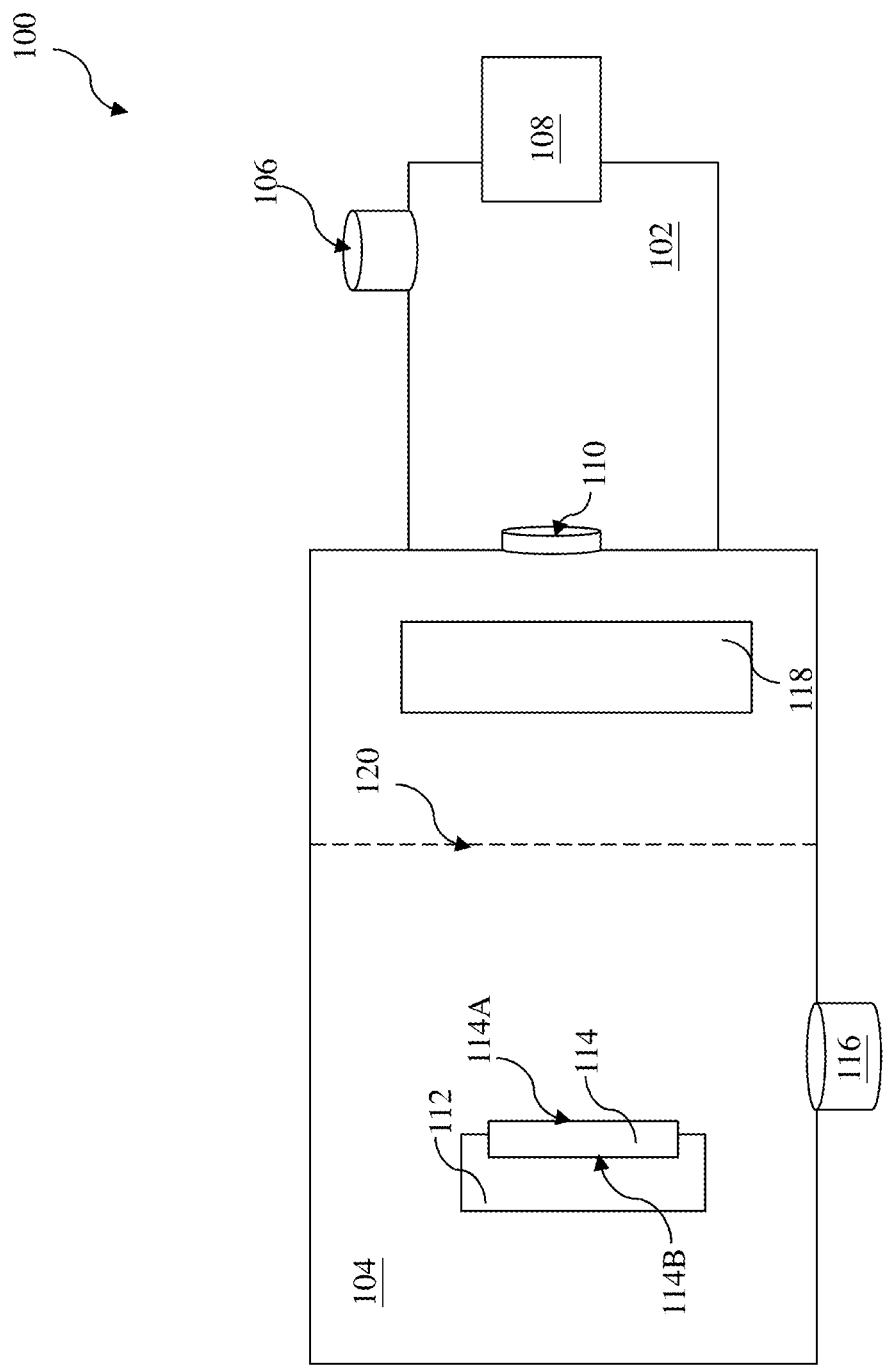
FIG. 1 is a block diagram of an integrated circuit fabrication (IC) system with a laser-charged particles interaction module (LCPIM) constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure provides an IC fabrication system and a method utilizing the same. The IC fabrication system includes laser to interact with the charged particles and modulate the charged particles directionally and dynamically in micro-zone mode. The IC fabrication system is designed for IC fabrication process, such as etch, deposition, or ion implantation. The charged particles include plasma, electron-beam or ion beam.

FIG. 1 illustrates a block diagram of a semiconductor fabrication system 100 in accordance with some embodiments. The semiconductor fabrication system 100 is designed with charged particles to provide a fabrication process, such as etching, implantation, deposition and proper treatment, to form integrated circuits (ICs) on a semiconductor substrate. The semiconductor fabrication system 100 includes a mechanism to modulate the charged particles by laser and control the corresponding fabrication process spatially for enhanced fabrication effect.

The semiconductor fabrication system 100 includes a plasma chamber 102 to generate plasma and a processing chamber 104 integrated with the plasma chamber 102 and designed to perform IC fabrication. The plasma chamber 102 is designed with a mechanism to generate plasma and further includes a gas inlet 106 to provide one or more gas to the plasma chamber 102. In some embodiments, the gas inlet 106 is designed to provide a carry gas, such as argon or helium; and a reactive gas, such as nitrogen, oxygen, chlorine, fluorine, hydrogen or a combination thereof for etching. In other embodiments, the reactive gas may include boron, phosphorous or other suitable gas for implantation. In yet other embodiments, the reactive gas may include silicon, germanium, or chemical compound (e.g., silane $SiH_4$ or germanium tetrahydride $GeH_4$) for deposition. The gas inlet 106 is connected to gas supplies and may include one or more valve to control corresponding gas flow rate(s).

The plasma chamber 102 further includes a plasma generator 108 with a proper mechanism to generate plasma. In some embodiments, the plasma generator 108 includes a capacitor to generate plasma by a capacitively coupled plasma (CCP) mechanism. In this case, a pair of plates are integrated with the plasma chamber 102 and are coupled to power lines such that an alternative current is applied to the plates, thereby generating plasma from the gas between the pair of plates. In some embodiments, the plasma generator 108 includes an inductor to generate plasma by an inductively coupled plasma (ICP) mechanism. In this case, an inductor (such as a solenoid) is integrated with the plasma chamber 102 and is coupled to power lines such that an alternative current is applied to the inductor, thereby generating plasma from the gas.

The processing chamber 104 is integrated with the plasma chamber 102 and is coupled with the plasma chamber to receive the plasma or charged particles (such as an electron-beam or an ion beam) extracted from the plasma generated in the plasma chamber 102 through a path, such as an interface module 110. The processing chamber 104 includes a structure defining an enclosed space for IC fabrication inside. The processing chamber 104 includes a substrate stage 112 designed to secure one or more semiconductor substrate 114. In various examples, the substrate stage 112 may include a vacuum chuck, electric chuck, clamps or other suitable mechanism to secure the semiconductor substrate(s) 114. The substrate stage 112 further includes a mechanism to move, such as translational movement or rotational motions. In some examples, the substrate stage 112 includes a rotation structure and a motor integrated to enable the corresponding motions of the substrate stage 112. The semiconductor substrate(s) 114 secured on the substrate stage 112 moves along with the substrate stage 112 during an IC fabrication process. The processing chamber 104 may include other components, such as an exhaust pipe 116 to exhaust the gas(es).

In some embodiments, the semiconductor substrate 114 is a silicon wafer. In some embodiments, the semiconductor substrate 114 may include an elementary semiconductor, such as germanium in a crystalline structure; a compound semiconductor, such as silicon germanium, silicon carbide, gallium arsenic, gallium phosphide, indium phosphide, indium arsenide, and/or indium antimonide; or combinations thereof. In furtherance of the embodiments, those semiconductor material films may be epitaxially grown on the silicon wafer. In some other embodiments, the semiconductor substrate 114 may be a semiconductor wafer of a different material (such as silicon carbide) or a substrate of some other material (such as a glass substrate for display or a fused quartz substrate for photomask).

The semiconductor substrate 114 has a front surface 114A and a backside surface 114B opposing from each other. One or more integrated circuits are formed, partially formed, or to-be formed on the front surface 114A of the semiconductor wafer 114. Therefore, the front surface 114A of the semiconductor wafer 114 may include a patterned material layer or a material layer to be patterned. For examples, the front surface 114A may include various isolation features (such as shallow trench isolation features), various doped features (such as doped wells, or doped source and drain features), various devices (such as transistors), various conductive features (such as contacts, metal lines and/or vias of an interconnection structure), packaging material layers (such as bonding pads and/or a passivation layer), or a combination thereof. On a completely fabricated semiconductor wafer, all above material layers and patterns may present on the front surface 114A of the semiconductor wafer 114. In the present example, the semiconductor wafer 114 is still in the fabrication, a subset of the above material layers may be formed on the front surface 114A. The backside surface 114B of the semiconductor wafer 114 secured on the substrate stage 112. Even tough, the front surface 114A of the wafer 114 may be patterned and has a topographical profile but, globally it is flat and parallel with the backside surface 114B.

The semiconductor fabrication system 100 further includes a laser-charged particle interaction module (LCPIM) 118 disposed between the substrate stage 112 and the interface module 110. The LCPIM 118 is designed to provide a laser beam and have the laser beam interacted with the charged particles to modulate thereof spatially and dynamically in a micro-zone mode. The interaction causes the charged particles to be modulated in terms of density, energy and direction of the charged particles. More particularly, the constructive interaction increases, and destructive interaction decreases the energy of the charged particles. The portions of the charged particles with increased energy have enhanced processing effect, such as enhanced etching effect.

The micro-zone mode refers to a spatial scale of the modulation and this spatial scale is in the order of nanometers. For example, the modulation causes the redistribution of the charged particles having high-density locations and low-density locations. The spatial scale may be defined as the distance from a high-density location and an adjacent low-density location in average. For example, the spatial scale is about 1 nm or about 10 nm. In some examples, the spatial scale is less than 100 nm or in a range from 1 nm to 100 nm. The LCPIM 118 provides a mechanism to modulate the charged particles in a micro-zone mode, which is advantageous to IC fabrication, especially in advanced node technology nodes with scaled-down feature sizes.

In some embodiments, the LCPIM 118 is embedded in the processing chamber 104. In some other embodiments, the LCPIM 118 is configured in a separated chamber interposed between and integrated with the plasma chamber 102 and the processing chamber 104, as illustrated by the dashed line 120. The LCPIM 118 may further include other mechanism to interact with the charged particles for further modulation. The LCPIM 118 is further described with reference to FIG. 2.

Figure 2:
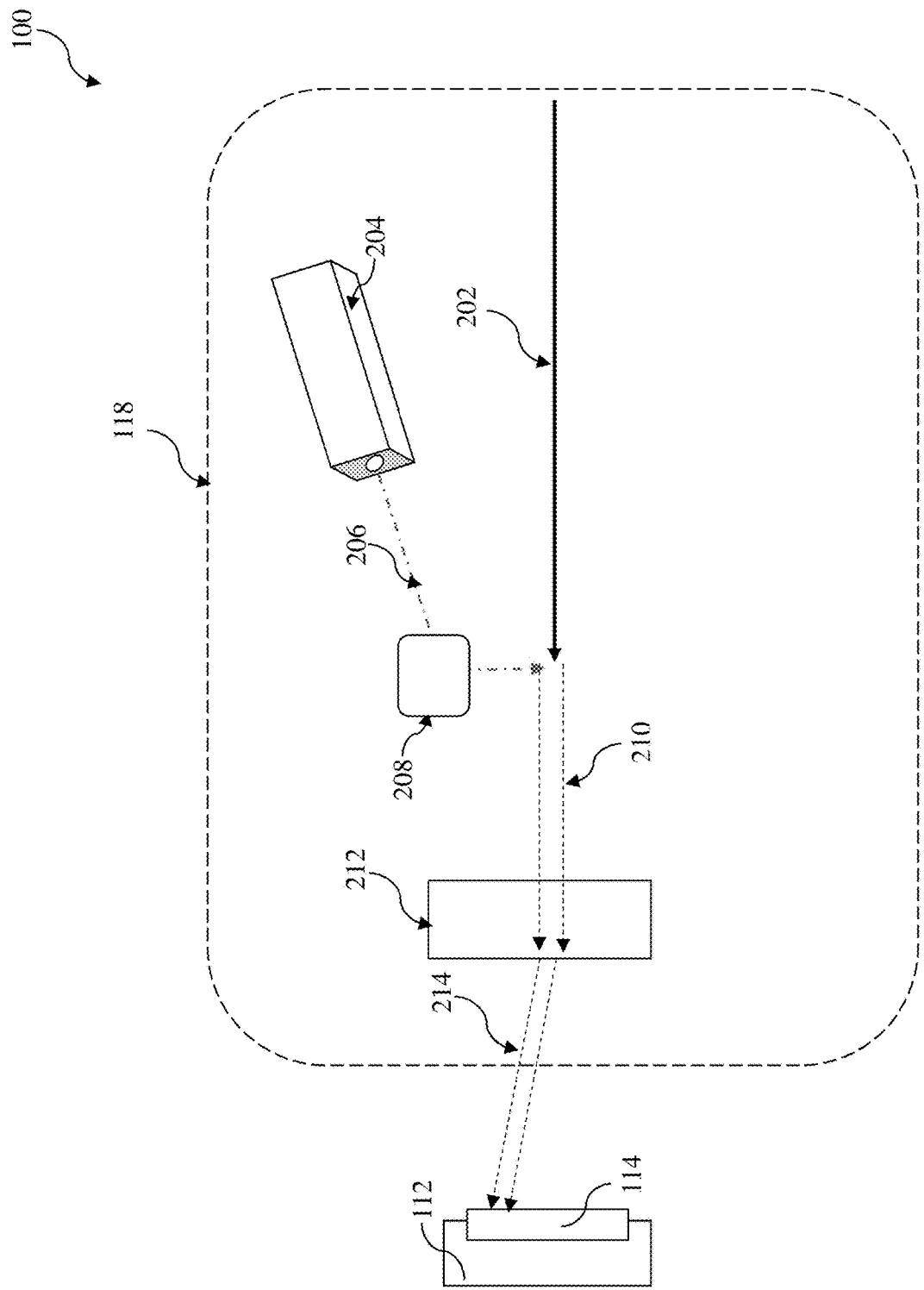
FIGS. 2, 3A and 3B are schematic views of the IC fabrication system in FIG. 1, constructed in accordance with some embodiments.

FIG. 2 is a schematic view of the semiconductor fabrication system 100, in portion, constructed in accordance with some embodiments. Especially, the charged particles 202 generated from the plasma chamber 102 interacts with laser and is modulated thereby before being applied to the wafer 114 for IC fabrication. The charged particles are manipulated by physical constrain, electric field, other suitable technique, or a combination thereof into a proper geometry and size, such as a spot beam or a ribbon beam. A ribbon beam has a limited width and a greater length. During the IC fabrication process, the ribbon beam is scanned across the semiconductor substrate 114 while the substrate stage 112 and the semiconductor substrate 114 secured thereon are translationally move along a direction perpendicular to the ribbon beam. In some embodiments, the charged particles are shaped into multiple ribbon beams with width and pitch adjustable.

The LCPIM 118 includes a laser source 204 to generate laser radiation, such as a laser beam 206. The laser source 204 may be a solid-state laser source, gas laser source or alternatively other suitable laser source. The LCPIM 118 also includes a laser optical module 208 to manipulate the laser beam such that the laser radiation is interacted with and modulates the charged particles 202 into laser-modulated charged particles 210, which is different from the charged particles 202 in energy, direction, distribution, or a combination thereof. In some embodiments, the laser optical module 208 includes various optical components configured to enable the laser radiation for effectively interacting with the charged particles 202.

In some embodiments, the LCPIM 118 further includes an electromagnetic (E-B) field module 212 to further module the charged particles 210 into the charged particles 214, such as bending or shifting thereof for fine tuning, scanning or a combination thereof. In one example, the E-B field module 212 is a magnet to bend the charged particles 210, thereby shifting the location of the charged particles reaching the wafer 114. In another example, the E-B field module 212 is a magnet with a nonuniform magnetic field such that the charged particles are bent and spread in an angle range when reaching the wafer 114.

Figure 3A:
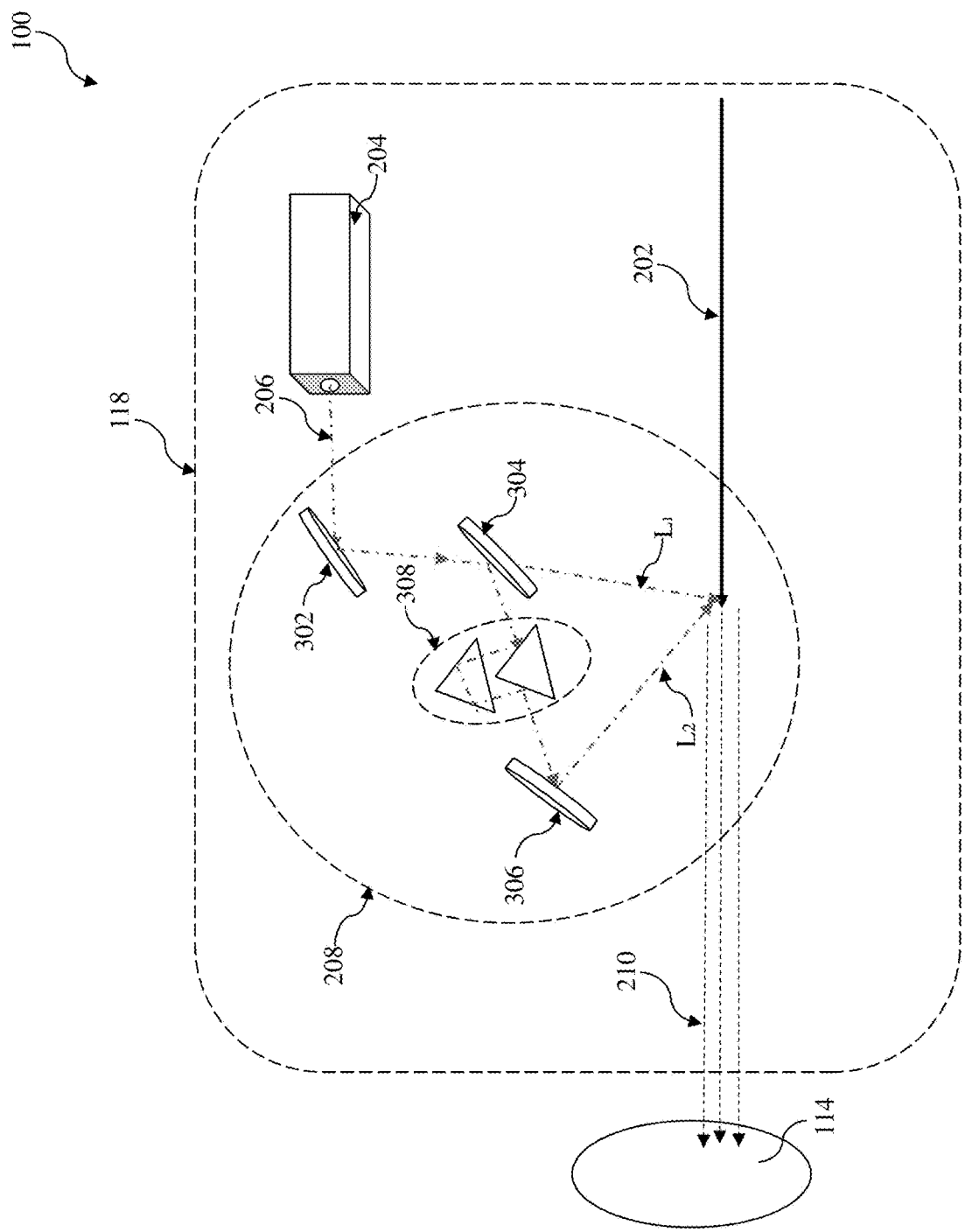

FIG. 3A is a schematic view of the semiconductor fabrication system 100, in portion, constructed in accordance with some embodiments. Especially, the charged particles 202 generated from the plasma chamber 102 interacts with laser and is modulated thereby before being applied to the wafer 114 for IC fabrication. The LCPIM 118 includes a laser source 204 to generate a laser beam 206. The LCPIM 118 also includes a laser optical module 208 to manipulate the laser beam such that the laser radiation is interacted with and modulates the charged particles 202 into laser-modulated charged particles 210, which is different from the charged particles 202 in energy, direction, distribution, or a combination thereof. In the present embodiment, the laser optical module 208 includes a mirror 302 to deflect the laser beam 206; a beam splitter 304 to split the laser beam 206 into two laser beams (a first laser beam $L_A$ and a second laser beam $L_B$), a mirror 306 to deflect the second laser beam in a configuration such that the first and second laser beams are met at a path of the charged particles 202. The laser optical module 208 further includes an optical delay unit 308 configured to the second laser beam (or alternatively the first laser beam) to increase the optical path and therefore to shift the optical phase of the second laser beam. In one example, the optical delay unit 308 includes two prisms configured such that the second beam has an additional optical path the direction thereof remains the same after the optical delay unit 308. The distance of the two prisms can be adjusted such that the desired phase shift is achieved.

The first and second laser beams meet and forms an interference pattern that has a periodic intensity distribution, which is further interacted with the charged particles 202, changing the distribution of the charged particles accordingly. This is further illustrated in FIG. 4 and is further described below.

Figure 4:
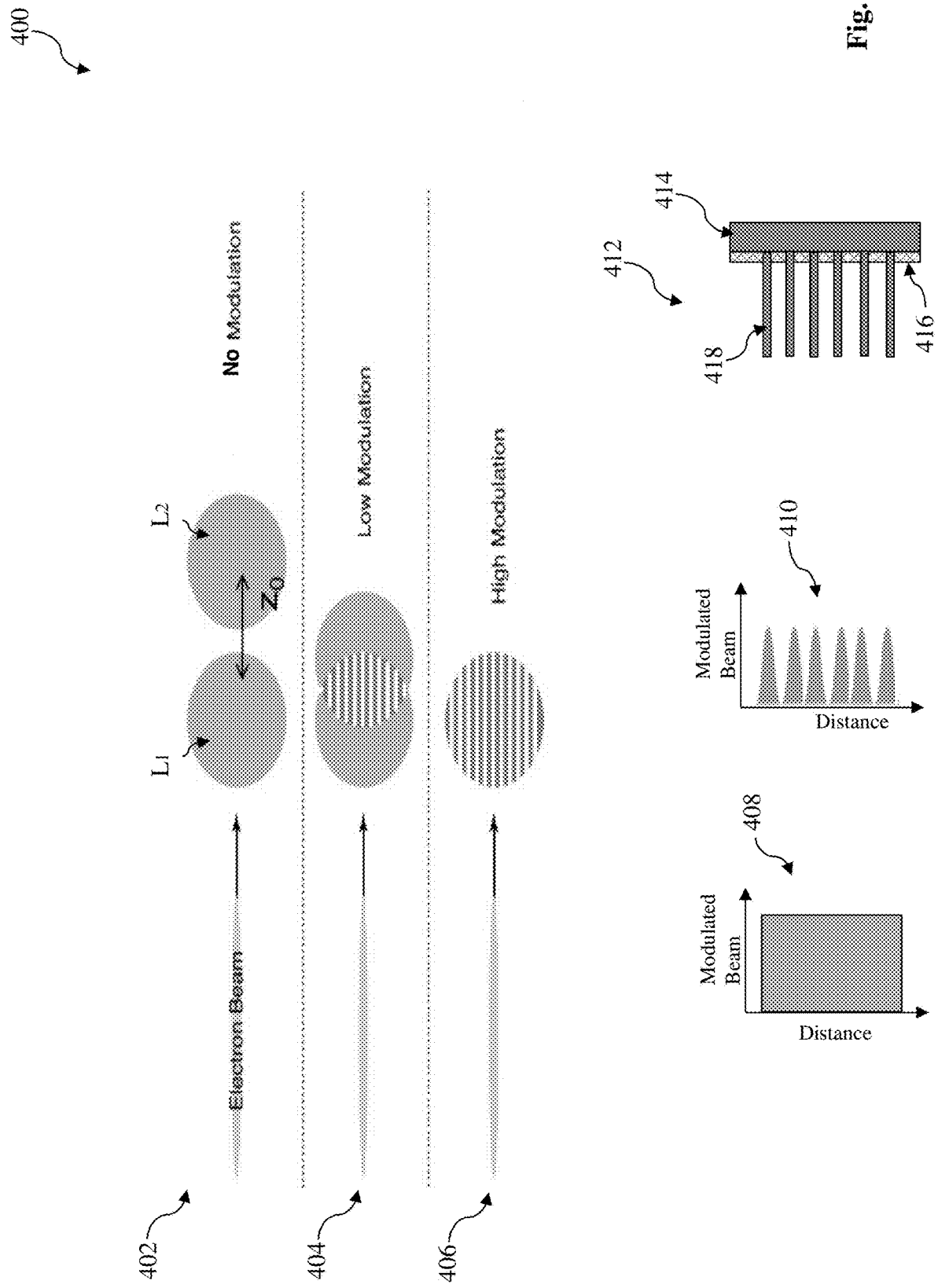
FIG. 4 is a schematic view of an interaction of e-beam with laser in the LCPIM in FIG. 1, constructed in accordance with some embodiments.

FIG. 4 is a schematic view of interaction of the laser and the charged particles constructed in accordance with various embodiments. In the present example for illustration, the charged particles are an e-beam. In a first situation 402, the two laser beams $L_1$ and $L_2$ are distanced away and are not interfered with each other. In this case, the laser beams have no modulation effect to the e-beam. In a second situation 404, the two laser beams $L_1$ and $L_2$ are partially overlapped and are interfered to form an interference pattern in the overlapped region. In this case, the laser beams have a certain modulation effect to the e-beam by the interference pattern of the laser. In a third situation 406, the two laser beams $L_1$ and $L_2$ are completely overlapped and are interfered to form an interference pattern. In this case, the laser beams have a high modulation effect to the e-beam. The laser interference pattern includes regions of destructive interference with minimum amplitude and regions of constructive interference with maximum amplitude periodically distributed. When the e-beam interacts with the laser, an interference pattern in the overlapped region is generated. The e-beam is modulated with energy, angle, or density distribution having peaks and valleys similar to those of the laser interference pattern. In some examples, the laser interference fringe has an interaction with the e-beam (or ion beam) to generate a controllable angle distribution of the e-beam (or ion beam), modulate the beam size, or modulate the beam energy, or collectively all those with desired patterning pitch, which could provide fin-tuning processing, such as etching to remove residues among high-aspect fin-fin spaces during a fin patterning process. The charged beam before the modulation is illustrated in 408 of FIG. 4 and the modulated charged beam (e-bean or ion beam) is illustrated in 410 of FIG. 4. In this example, a large size charged beam is modulated into multiple small size beams, which can be applied to a workpiece 412. The workpiece 412 includes a semiconductor substrate 414, isolation features 416 and fin active regions 418 extruded from the semiconductor substrate 414. The modulated beam etches the isolation features 416 with high quality free of residues. The capability of modulating the e-beam (or ion beam) by the laser interference fringe is able to produce directional charged beam tuned in micron-zone area of its beam energy, beam size and beam angle distribution for etching or implantation according to a design pattern with small pitch, high aspect ratio, and different CD, such as a circuit pattern with jog, isolated pattern, dense pattern or with different pattern loading in various circuits. The additional bending magnet or other suitable bending mechanism in the E-B field module 212 helps to widen the angle distribution and modulation pitch. Here the modulation pitch is defined as periodic distance in the laser interference fringe and the charged beam modulated accordingly.

Figure 3B:
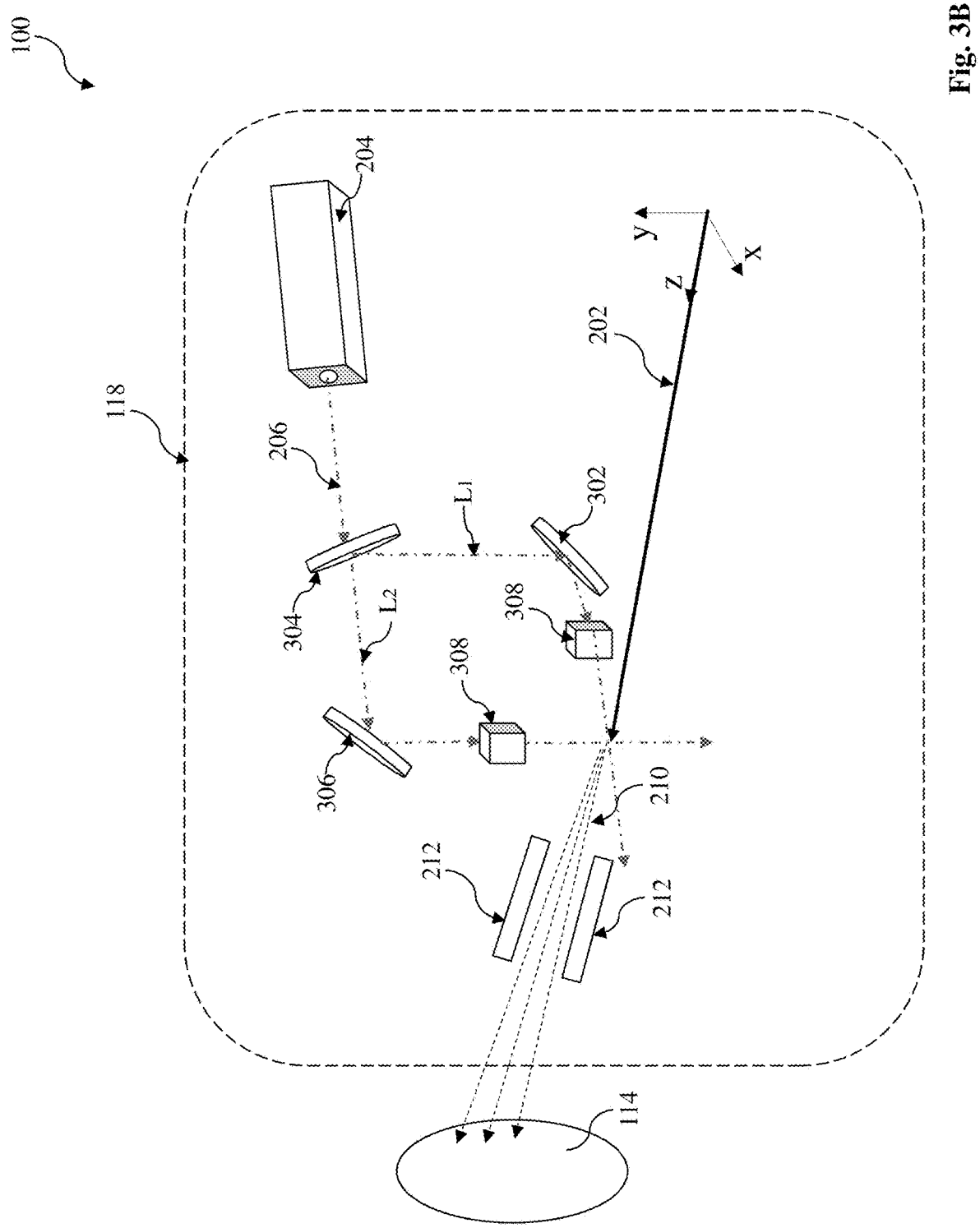

FIG. 3B is a schematic view of the semiconductor fabrication system 100, in portion, constructed in accordance with some embodiments. The semiconductor fabrication system 100, especially the LCPIM 118 of FIG. 3B is similar to those of FIG. 3A but with alternative and additional features and configurations. The descriptions of the similar components are not repeated. In FIG. 3B, the charged particles 202 generated from the plasma chamber 102 interacts with laser and is modulated thereby before being applied to the wafer 114 for IC fabrication. The LCPIM 118 includes a laser source 204 to generate a laser beam 206 and a laser optical module 208 to manipulate the laser beam such that the laser radiation is interacted with and modulates the charged particles 202 into laser-modulated charged particles 210, which is different from the charged particles 202 in terms of energy, direction, distribution, or a combination thereof. In the present embodiment, the laser optical module 208 includes a beam splitter 304 to split the laser beam 206 into two laser beams (a first laser beam $L_1$ and a second laser beam $L_2$), a mirror 302 to deflect the first laser beam $L_1$; a mirror 306 to deflect the second laser beam $L_2$ in a configuration such that the first and second laser beams are met at a path of the charged particles 202. The laser optical module 208 further includes an optical delay unit 308 configured to the first laser beam $L_1$ and another optical delay unit 308 configured to the second laser beam $L_2$ for shifting the respective optical phases. In this case, the optical path difference between the two laser beams is minimized and the interference effect is maximized. In FIG. 3B, the LCPIM 118 also includes an E-B field module 212 to further modulate the charged particles 210.

Figure 5A:
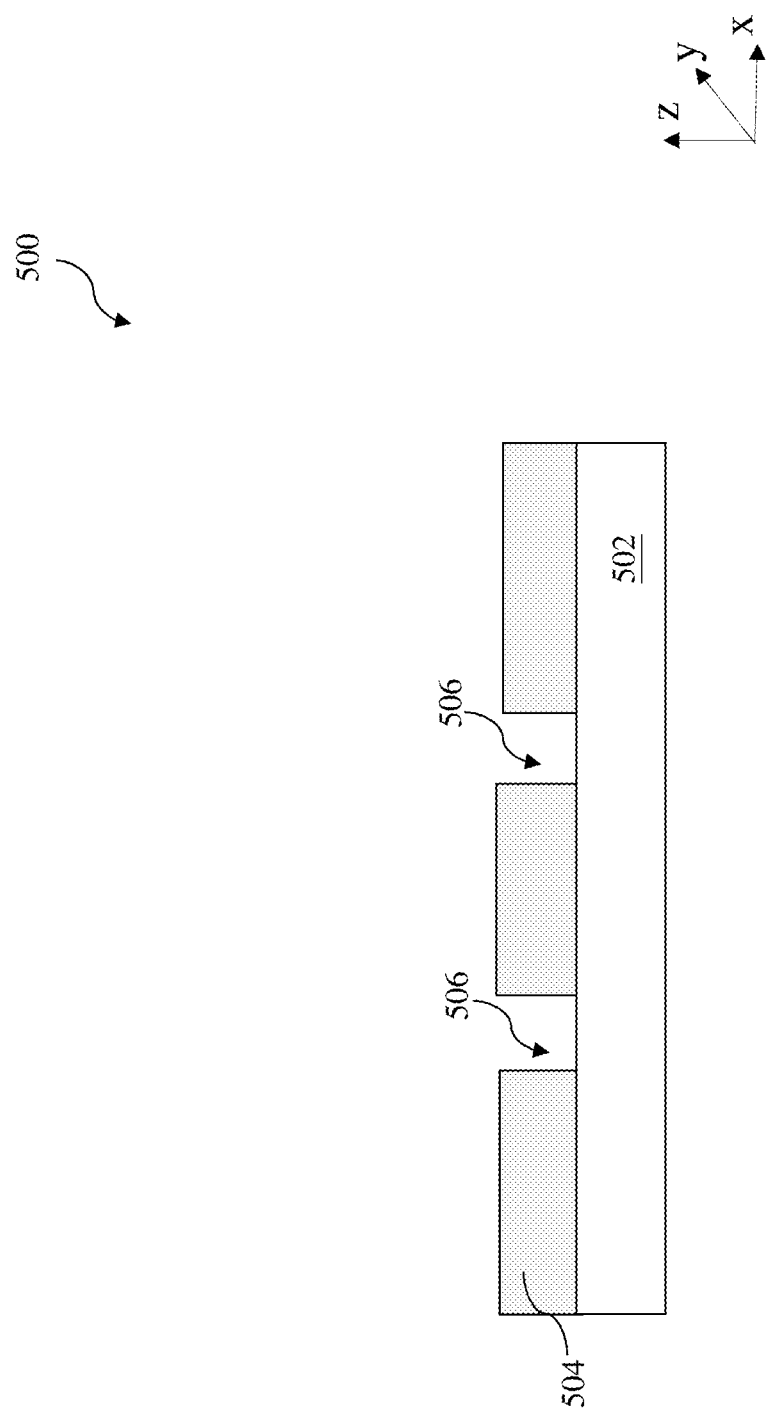
FIGS. 5A and 5C are sectional views of a semiconductor structure at various fabrication stages and fabricated using the IC fabrication system of FIG. 1, constructed in accordance with some embodiments.
Figure 5B:
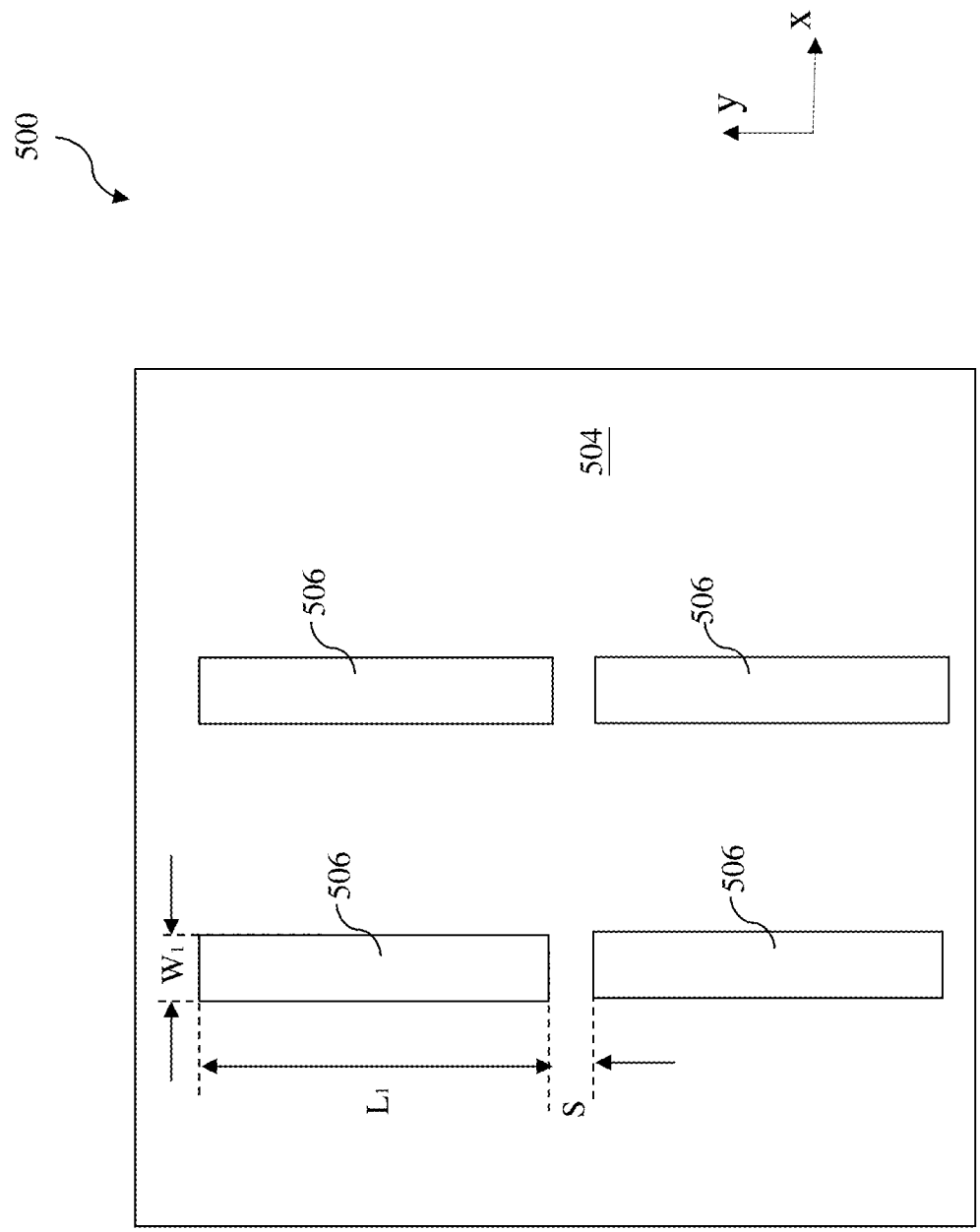
FIGS. 5B and 5D are top views of a semiconductor structure at various fabrication stages and fabricated using the IC fabrication system of FIG. 1, constructed in accordance with some embodiments.
Figure 5C:
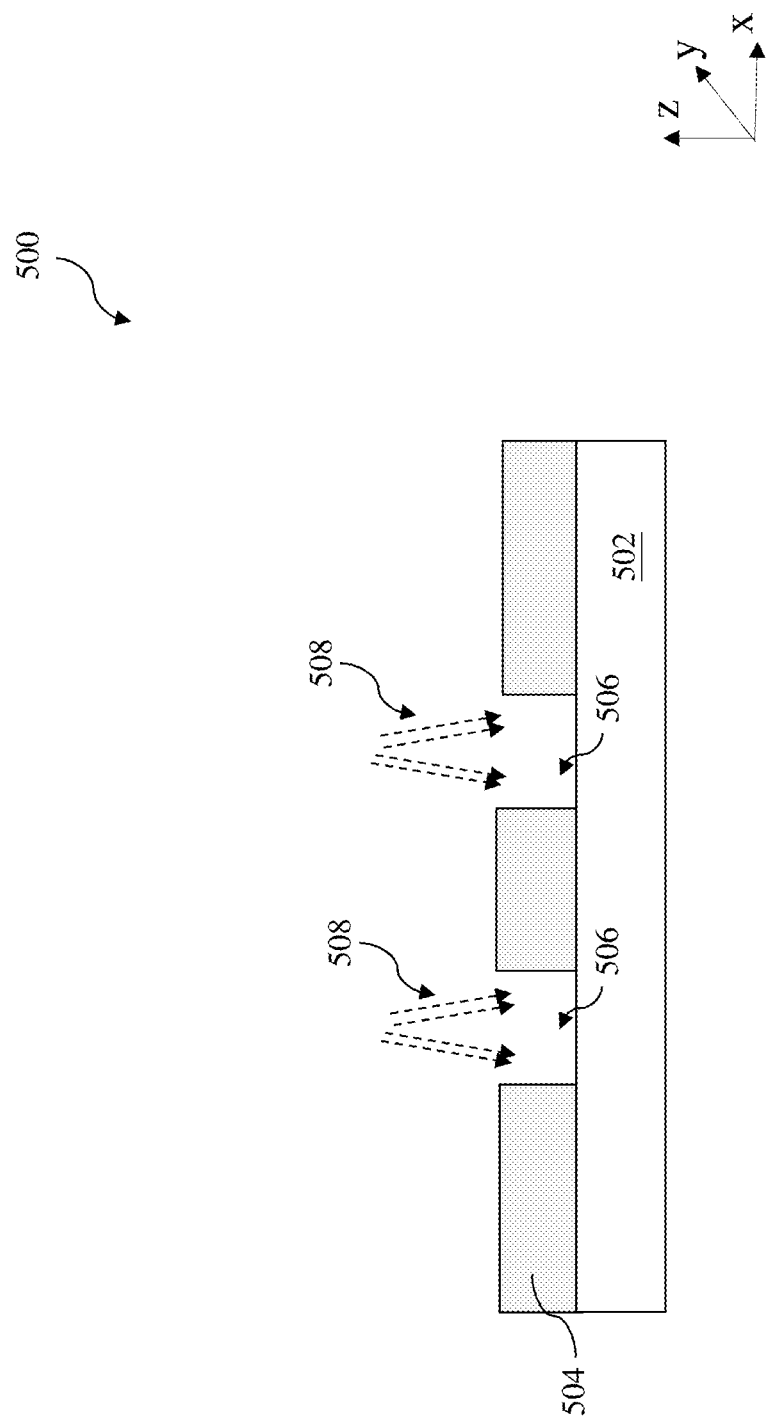
Figure 5D:
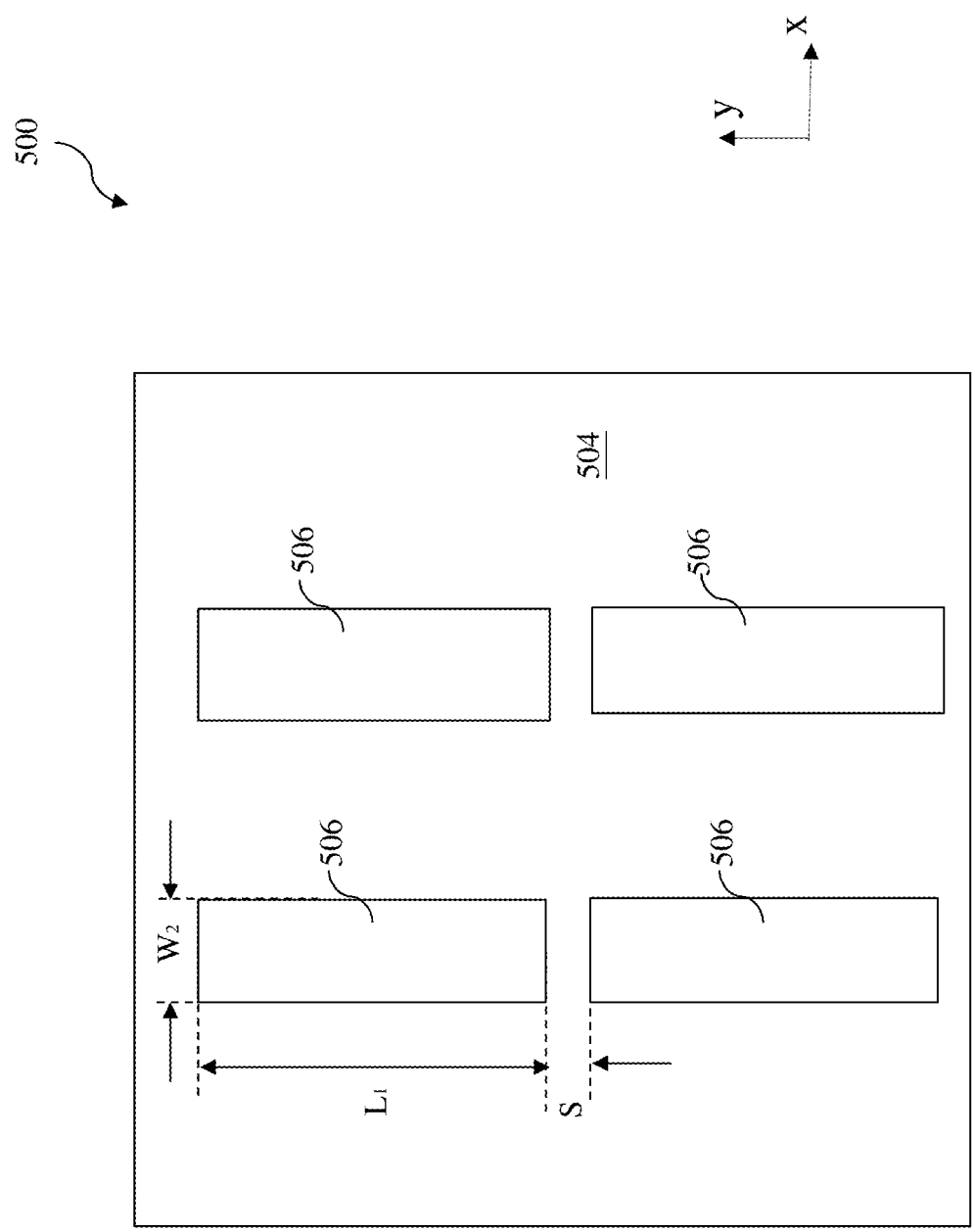
Figure 6:
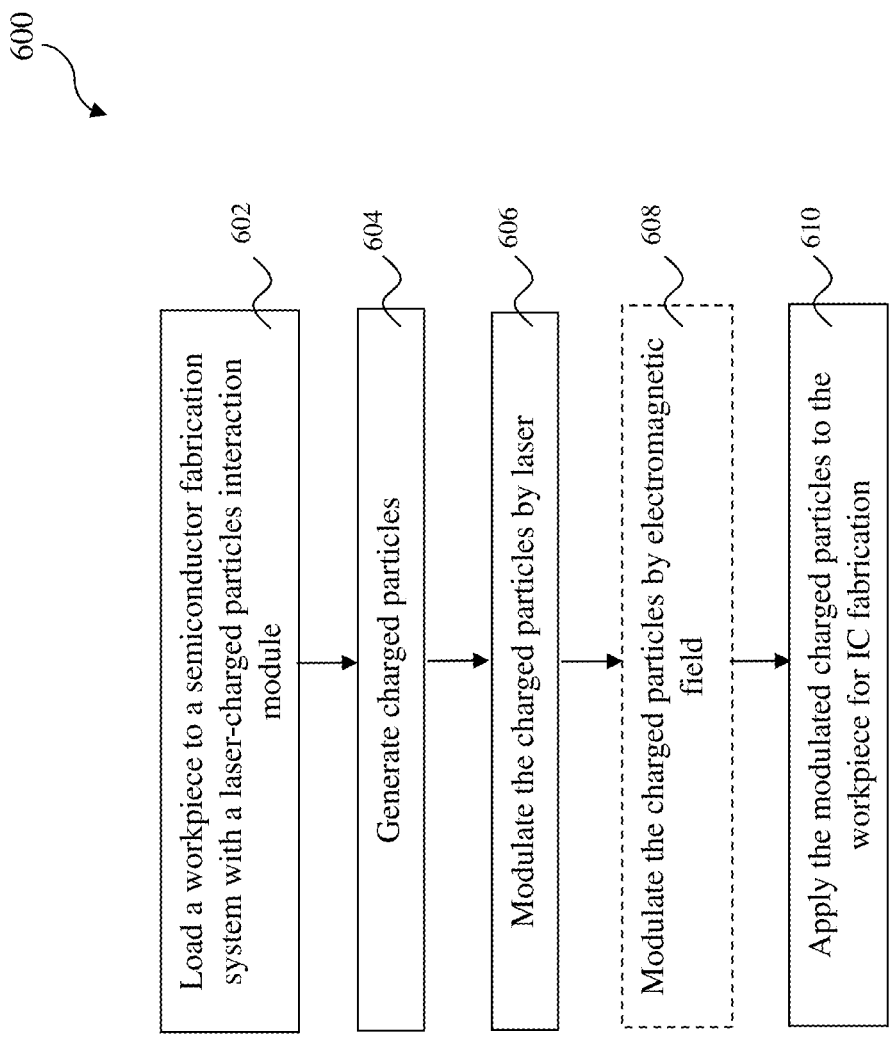
FIG. 6 is a flowchart of a method making the semiconductor structure of FIGS. 5A-5D utilizing the IC fabrication system of FIG. 1, constructed in accordance with some embodiments.

FIG. 5A is a sectional view, FIG. 5B is a top view, 5C is a sectional view, and FIG. 5D is a top view of a workpiece 500 at various fabrication stages, constructed in accordance with some embodiments. FIG. 6 is a flowchart of a method 600 fabricating the workpiece 500 in accordance with some embodiments. The method 600 and the workpiece 500 are collectively described as one embodiments to implement the semiconductor fabrication system 100.

Referring to a block 602 of FIG. 6 and FIGS. 5A and 5B, the method 600 begins by loading a workpiece 500 into the semiconductor fabrication system 100 that includes a LCPIM 118. The LCPIM 118 may have a different structure, such as those illustrated in FIGS. 2, 3A and 3B. In the present example, the workpiece 500 is a semiconductor wafer 114, such as a silicon wafer. The workpiece 500 is loaded and secured on the substrate stage 112 for a fabrication process, such as etching in the present example. The workpiece 500 includes a semiconductor substrate and a material layer 504, such as a dielectric material layer, formed on the semiconductor substrate. Alternatively, the material layer 504 is a portion of the semiconductor substrate 502 and includes a semiconductor material (such as silicon, silicon germanium or other suitable semiconductor materials) same or different from that of the semiconductor substrate 502. The workpiece 500 may include additional material layers and device features not shown in FIGS. 5A and 5B. Those material layers and device features may be formed in the semiconductor substrate 502 or disposed between the semiconductor substrate 502 and the material layer 504. The material layer 504 further includes trenches 506 formed by patterning, which further includes lithography processing and etching. In one example, the material layer 504 is an interlayer dielectric material layer (ILD) and the trenches 506 are formed for filling metal lines (or contacts or vias) during a damascene process.

As illustrated in FIG. 5B, thus formed trenches 506 have a width $W_1$, a length $L_1$, and spacing S between the adjacent trenches 506. When the feature sizes are scaled down, it is difficult to control those dimensions in the proper ranges. For example, if the width of the trenches 506 is intended to be increased or be greater than $W_1$, the spacing S is reduced with concerns of bridging. When the spacing is designed with a greater value to reduce the bridging concern, the circuit packing density is reduced, which is not a cost-effective solution. In the disclosed method 600, the semiconductor fabrication system 100 is applied to the workpiece 500 to eliminate or reduce the concerns.

Particularly, the method 600 proceeds to an operation 604 to generate the charged particles by the semiconductor fabrication system 100. The charged particles may be plasma, or an e-beam or an ion beam extracted from the plasma. In the present example, the plasma is employed for directional etching. The plasma is biased to be directional with bombardment effect to etch the material layer 504. The plasma may be generated from an etching gas, such as a fluorine-containing gas ($CF_4$, $SF_6$, $NF_3$, $CH_2F_2$) or a chlorine-containing gas ($Cl_2$, $CCl_2F_2$) according to some examples.

The method 600 further proceeds to an operation 606 by modulating the plasma 508 such that the plasma has a density distribution aligned to the trenches and directions substantially toward the workpiece 500 (substantially along the Z direction), as illustrated in FIG. 5C. Furthermore, the plasma 508 is modulated to have slightly tilted angles along X direction but not tilting along Y direction. This can be controlled either by E-B field module 212, such as a magnet with non-unit magnetic field in an operation 608, or alternatively by laser interaction for the expected effect. In various embodiments, a ribbon beam is controlled by an electric field (such as by corresponding electrode voltage, and Z gap); or plasma density (such as by gas flow, radio-frequency power, pressure, and etc. of the plasma chamber).

Referring to FIGS. 5C and 5D, the method 600 proceeds to an operation 610 by applying the modulated charged particles to the workpiece for IC fabrication. In the present example, the modulated plasma 508 is applied to etch the material layer 504 such that the certain dimension of the trenches 506 are changed while other dimensions thereof remain substantially unchanged. Particularly, the plasma etching only pushes width of the trenches 506 larger from $W_1$ to $W_2$ ($>W_1$) without changing the length of the trenches 506. Accordingly, the spacing between the adjacent trenches 506 along the Y direction remains unchanged, as illustrated in FIG. 5D. In the present embodiment that the material layer 504 includes a dielectric material, such as silicon oxide, the plasma includes fluorine-containing ions. In other embodiments that the material layer 504 includes a semiconductor material, such as silicon, the plasma may include chlorine-containing ions.

The operation 610 provides a technique to trim or modify a patterned structure, such as trenches, which pushes the critical dimension (CD) at one direction across the workpiece 500 and keeps the CD at another direction unchanged. The CD push can be controlled with a certain push amount or different amounts, such as among jog features, a line pattern with a pitch, isolated or dense patterns.

Figure 7:
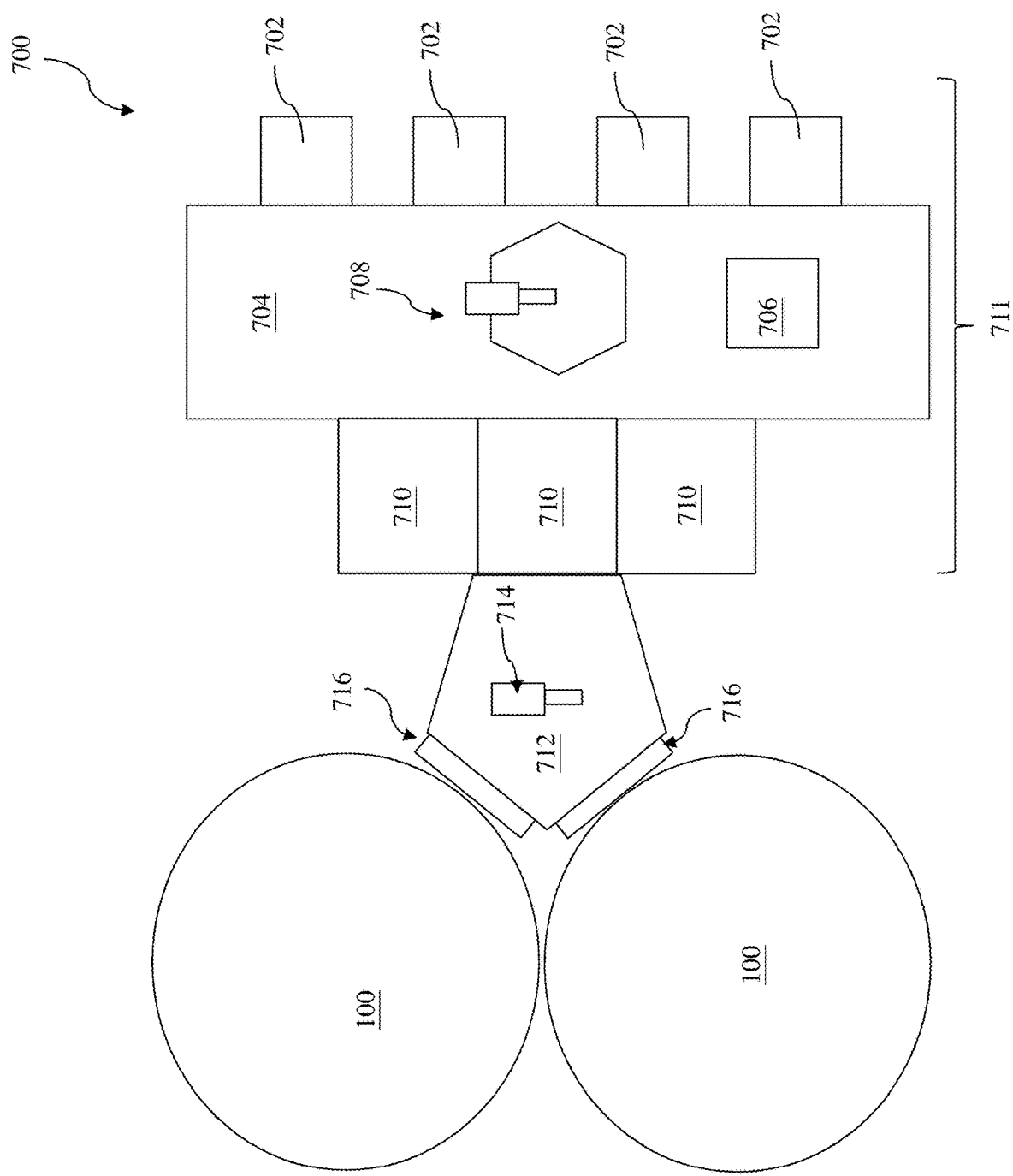
FIG. 7 is a block diagram of an LCPIM apparatus having multiple IC fabrication systems of FIG. 1, constructed in accordance with some embodiments.

FIG. 7 is a block diagram of an LCPIM fabrication apparatus 700 having a LCPIM 118 in accordance with some embodiments. The LCPIM fabrication apparatus 700 includes one or more IC fabrication systems 100 integrated together in a cluster tool. In an illustrative embodiment, the LCPIM fabrication apparatus 700 includes two IC fabrication systems 100 properly configured and integrated.

The LCPIM fabrication apparatus 700 includes one or more load port 702, through which wafers are loaded and unloaded to the LCPIM fabrication apparatus 700. In the present embodiments, the wafers are loaded and unloaded in batches, by using wafer containers, such as front opening unified pods (FOUPs).

The LCPIM fabrication apparatus 700 may include a loader (or front-end unit) 704 for holding, manipulating and transferring wafers. For examples, the loader 704 includes one or more substrate stage 706 for holding and/or orienting one or more wafer. In other examples, the loader 704 includes one or more robot 708 for handling wafers, such as transferring wafers to the IC fabrication systems 100 or to load lock chambers (or load lock units) 710. The robot 708 is configured between the load port 702 and the load lock chambers in a way for proper wafer transferring therebetween. For example, each wafer is transferred by the robot 708 from the load port 702 or from the substrate stage 706 to one of load lock chambers or is transferred back to the load port 702 by the robot 708. In some embodiments, the LCPIM fabrication apparatus 700 may further include other components, such as one or more load lock chambers 710 configured and designed for various functions, such as pre-orientation and preconditioning. The preconditioning may include degassing, pre-heating or other functions. For examples, multiple load lock chambers 710 may designed and configured for various preconditioning functions, respectively. In some examples, a wafer is oriented, degassed and/or pre-heated in one of the load lock chambers 710 to prepare the wafer for the processing by the charged particles, such as etching, ion implantation or deposition. The LCPIM fabrication apparatus 700 may be configured differently. For example, the load lock chamber 710 in the middle may be used as a path to transfer the wafer(s). In other examples, the LCPIM fabrication apparatus 700 further includes a vacuum module integrated to provide vacuum conditions to respective regions, such IC fabrication systems 100. The load ports 702, the loader 704 and the load lock chambers 710 are collectively referred to as a load lock module 711.

The LCPIM fabrication apparatus 700 may further include a transfer module 712 for wafer transfer between the IC fabrication systems 100 and the load lock module 711. In some embodiments, the transfer module 712 further includes one or more robot 714 for wafer transferring. The transfer module 712 has openings (doors) 716 connected to the IC fabrication systems 100, respectively.

Figure 8:
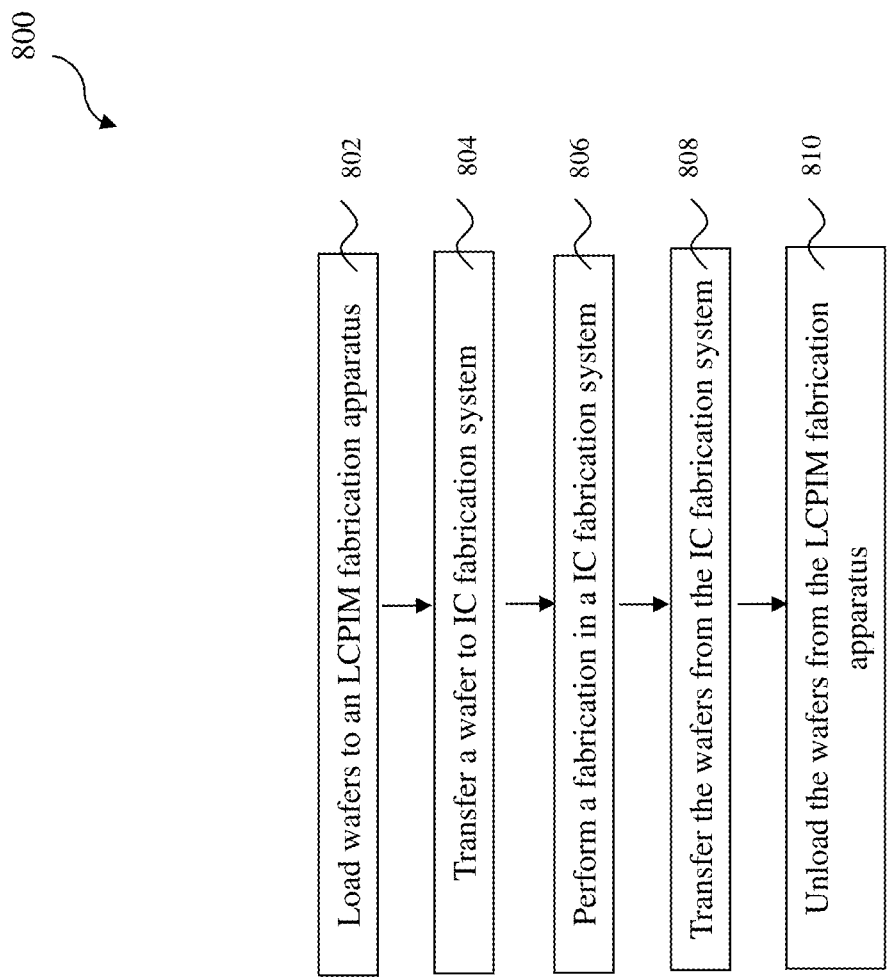
FIG. 8 is a flowchart of a method utilizing the LCPIM apparatus of FIG. 7, constructed in accordance with some embodiments.

FIG. 8 is a flowchart of a method 800 fabricating one or more semiconductor wafers 114 (such as depositing a thin film, etching a material layer, performing an ion implantation to a semiconductor layer by LCPIM technique), in accordance with some embodiments. The method 800 is implemented in the LCPIM fabrication apparatus 700 of FIG. 7. The method 800 is described with reference to FIGS. 7, 8 and other figures.

The method 800 includes an operation 802 to load one or more wafers to the LCPIM fabrication apparatus 700 through the load ports 702. For example, wafers are in one or more batches, such as in FOUPs, are loaded to the LCPIM fabrication apparatus 700 through the load ports 702 in one or more steps, such as loading, degassing, pre-heating, orienting or a subset thereof.

The method 800 includes operation 804 to transfer one or more wafer to one of the IC fabrication system 100 by the robot 714 through the opening 716. For example, the robot 714 sequentially transfers one or more wafer to each of the IC fabrication systems 100. In other examples, the transfer module 712 may include two or more robots 714 to simultaneously transfer wafers to respective IC fabrication systems 100. Specifically, in the present embodiment, six wafers 114 are transferred to the substrate stage 706 of the corresponding IC fabrication system 100 in a configuration that the front surface 114A faces toward the charged particles, as illustrated in FIGS. 1 and 2.

The method 800 proceeds to an operation 806 to perform a IC fabrication process to the wafer(s) 114 in one of the IC fabrication system 100. The operation 806 and following operations are described with one IC fabrication system 100 and one wafer. However, as described above, the multiple wafers may be processed in one of multiple IC fabrication systems 100 and the multiple IC fabrication systems 100 may work in parallel. In various embodiments, the IC fabrication process may include an ion implantation, etching or deposition using the modulated charged particles on the front surface 114A of each wafer 114 during the operation 806.

During the deposition process, various components and units of the LCPIM fabrication apparatus 700 work collectively and synergistically. Accordingly, the operation 806 includes various sub-operations, such as those described in FIG. 6.

After the completion of the IC fabrication process to the wafer 114 in the IC fabrication system 100 by the operation 806, the method 800 proceeds to an operation 808 to transfer the wafer 114 to the load lock chamber(s) 710 by the robot 714. This operation is similar to the operation 804 but it is reversed. For example, the multiple wafers are transferred to the load lock chambers 710 from the IC fabrication system 100, sequentially or in parallel by multiple robots 814.

The method 800 may further include an operation 810 to unload the wafers from the LCPIM fabrication apparatus 700 through the load port 702. The method 800 may include other operations, before, during or after the operations described above. For example, after the operation 810, the wafers 114 may be transferred to other fabrication tools for following fabrications, such as lithography patterning process.

The LCPIM fabrication apparatus 700 and the method 800 may have other embodiments, or alternatives. For examples, even though the method 800 describes a procedure to perform a directional plasma etching process to a wafer by LCPIM technique, such as the method 600 of FIG. 6, the LCPIM fabrication apparatus 700 and the method 800 utilizing the same may be used to perform other etching, ion implantation and deposition.

The present disclosure provides an LCPIM fabrication apparatus and a method utilizing the same. The LCPIM fabrication apparatus is designed for IC fabrication process, such as etch, deposition, or ion implantation. The LCPIM fabrication apparatus includes laser to interact with the charged particles and modulate the charged particles in micro-zone mode. The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed LCPIM apparatus and the corresponding LCPIM technique, the IC fabrication (etch, deposition, or ion implantation) is controlled and modulated directionally and dynamically in micro-zone mode so that the corresponding IC fabrication process is more advantageous, such as etching to increase trenches in one direction and remain unchanged in another direction. Other advantages may include fine control to IC fabrication for advanced technology modes with less feature sizes, less manufacturing cost and higher manufacturing throughput.

The present disclosure provides a semiconductor fabrication apparatus that includes a source chamber being operable to generate charged particles; and a processing chamber integrated with the source chamber and configured to receive the charged particles from the source chamber. The processing chamber includes a wafer stage being operable to secure and move a wafer, and a laser-charged particles interaction module being operable to modulate the charged particles by a laser in a micron-zone mode for processing the wafer using the charged particles.

The present disclosure provides a semiconductor fabrication apparatus that includes a source chamber being operable to generate an electron-beam (e-beam); a processing chamber integrated with the source chamber and configured to receive the charged particles from the source chamber; a wafer stage configured in the processing chamber, the wafer stage being operable to secure and move a wafer; and a laser-e-beam interaction module being operable to modulate the e-beam by a laser to have a spatial pattern in a micron-zone mode while processing the wafer using the e-beam.

The present disclosure provides a method that includes loading a wafer into a semiconductor fabrication apparatus, wherein the semiconductor fabrication apparatus includes a source chamber being operable to generate charged particles; a processing chamber integrated with the source chamber and configured to receive the charged particles from the source chamber; a wafer stage configured in the processing chamber and being operable to secure and move the wafer; and a laser-charged particles interaction module being operable to modulate the charged particles by a laser in a micron-zone mode for processing the wafer using the charged particles. The method further includes generating the charged particles in the semiconductor fabrication apparatus; interfering a laser beam with the charged particles such that the charged particles are spatially modulated; and performing a semiconductor process to the wafer using the modulated charged particles.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor fabrication apparatus, comprising:
    a source chamber being operable to generate charged particles; and
    a processing chamber integrated with the source chamber and configured to receive the charged particles from the source chamber, wherein the processing chamber includes
        a wafer stage being operable to secure and move a wafer, and
        a laser-charged particles interaction module that further includes a laser source to generate a first laser beam; a beam splitter configured to split the first laser beam into a second laser beam and a third laser beam; and a mirror configured to reflect the third laser beam such that the third laser beam is redirected to intersect with the second laser beam to form a laser interference pattern at a path of the charged particles, and wherein the laser interference pattern modulates the charged particles in a micron-zone mode for processing the wafer using the modulated charged particles.

2. The semiconductor fabrication apparatus of claim 1, wherein the charged particles include an electron-beam (e-beam).

3. The semiconductor fabrication apparatus of claim 1, wherein the charged particles include an ion-beam.

4. The semiconductor fabrication apparatus of claim 1, wherein the processing of the wafer includes performing an etching process to the wafer using the charged particles.

5. The semiconductor fabrication apparatus of claim 1, wherein the processing of the wafer includes performing an ion implantation process to the wafer using the charged particles.

6. The semiconductor fabrication apparatus of claim 1, wherein the laser-charged particles interaction module is operable to modulate the charged particles by the laser interference pattern to have a spatial distribution of at least one of energy, angle and density in the micron-zone mode.

7. The semiconductor fabrication apparatus of claim 1, wherein the laser-charged particle interaction module further includes a laser interaction unit and an electromagnetic-field interaction unit configured in series on a path of the charged particles such that the charged particles are sequentially modulated by the laser interaction unit and the electromagnetic-field interaction unit.

8. The semiconductor fabrication apparatus of claim 7, wherein the laser-charged particles interaction module is operable to modulate the charged particles dynamically over time while the wafer stage and the wafer secured on the wafer stage move relative to the charged particles.

9. The semiconductor fabrication apparatus of claim 7, wherein the laser-charged particles interaction module is configured to form the interference pattern such that the charged particles are modulated to be spatially distributed with high intensity nodes and low intensity nodes.

10. The semiconductor fabrication apparatus of claim 9, wherein the laser-charged particles interaction module further includes another mirror configured to reflect the second laser beam such that the second laser beam is redirected to intersect with the third laser beam at the path of the charged particles.

11. The semiconductor fabrication apparatus of claim 10, wherein the laser-charged particles interaction module further includes an optical delay unit configured in a path of the third laser beam to increase an optical path of the third laser beam such that the second and third laser beams are intersected to form an interference pattern with a desired phase shift.

12. The semiconductor fabrication apparatus of claim 11, wherein the optical delay unit includes two prisms configured such that the third beam has an additional optical path with a distance of the two prisms adjustable to achieve the desired phase shift.

13. The semiconductor fabrication apparatus of claim 1, wherein the charged particles are modulated by laser from the laser interaction unit through a plasma oscillation mode.

14. A semiconductor fabrication apparatus, comprising:
    a source chamber being operable to generate an electron-beam (e-beam);
    a processing chamber integrated with the source chamber and configured to receive the e-beam from the source chamber;
    a wafer stage configured in the processing chamber, the wafer stage being operable to secure and move a wafer; and
    a laser-e-beam interaction module being operable to modulate the e-beam by a laser to have a spatial pattern in a micron-zone mode while processing the wafer using the e-beam, wherein
    the laser-e-beam interaction module includes a laser interaction unit and an electromagnetic-field interaction unit configured in series on a path of the e-beam such that the e-beam is sequentially modulated by the laser interaction unit and the electromagnetic-field interaction unit, and
    the laser-e-beam interaction module includes a laser source to generate a first laser beam; a beam splitter configured to split the first laser beam into a second laser beam and a third laser beam; a mirror configured to reflect the third laser beam such that the third laser beam is redirected to intersect with the second laser beam at a path of the e-beam; and an optical delay unit configured in a path of the third laser beam to increase an optical path of the third laser beam such that the second and third laser beams are intersected to form an interference pattern to modulate the e-beam.

15. The semiconductor fabrication apparatus of claim 14, wherein the processing of the wafer includes performing an etching process to the wafer using the e-beam.

16. The semiconductor fabrication apparatus of claim 14, wherein the electromagnetic-field interaction unit includes a magnet designed with a nonuniform magnetic field such that the e-beam is bent and spread in an angle range when reaching the wafer.

17. The semiconductor fabrication apparatus of claim 14, wherein the laser-e-beam interaction module is configured to form an interference pattern such that the e-beam is modulated to be spatially distributed with high intensity nodes and low intensity nodes.

18. The semiconductor fabrication apparatus of claim 14, wherein the optical delay unit includes two prisms configured such that the third beam has an additional optical path with a distance of the two prisms adjustable to achieve the desired phase shift.

19. A semiconductor fabrication apparatus, comprising:
a source chamber being operable to generate charged particles; and
a processing chamber integrated with the source chamber and configured to receive the charged particles from the source chamber, wherein the processing chamber includes
a wafer stage being operable to secure and move a semiconductor wafer, and
a laser-charged particles interaction module that further includes a laser source to generate a first laser beam;
a beam splitter configured to split the first laser beam into a second laser beam and a third laser beam; a mirror configured to reflect the third laser beam such that the third laser beam is redirected to intersect with the second laser beam to form a laser interference pattern at a path of the charged particles; and a laser interaction unit and an electromagnetic-field interaction unit configured in series on a path of the charged particles such that the charged particles are sequentially modulated by the laser interaction unit and the electromagnetic-field interaction unit, wherein the laser interference pattern modulates the charged particles in a micron-zone mode to process the semiconductor wafer using the modulated charged particles.

20. The semiconductor fabrication apparatus of claim 19, wherein
the charged particles include an ion-beam;
the laser-charged particles interaction module is operable to modulate the charged particles by the laser interference pattern to have a spatial distribution of at least one of energy, angle and density in the micron-zone mode; and
the laser-charged particles interaction module further includes another mirror configured to reflect the second laser beam such that the second laser beam is redirected to intersect with the third laser beam at the path of the charged particles.

* * * * *